United States Patent [19]

Hall

[11] Patent Number: 4,981,248

[45] Date of Patent: Jan. 1, 1991

[54] ELECTRONICALLY CONTROLLED WAVE SOLDER MASK SHIELD

[75] Inventor: James L. Hall, Burlington, Vt.

[73] Assignee: Digital Equipment Corporation, Maynard, Mass.

[21] Appl. No.: 368,562

[22] Filed: Jun. 20, 1989

[51] Int. Cl.⁵ .......................... B23K 3/00; B23K 3/06
[52] U.S. Cl. ........................................ 228/8; 228/39; 118/406; 118/504
[58] Field of Search .................... 228/37, 39, 260, 261, 228/57, 102, 7, 8; 118/301, 406, 504

[56] References Cited

U.S. PATENT DOCUMENTS

| | | | |
|---|---|---|---|
| 3,616,984 | 11/1971 | Voroba | 228/39 |
| 3,919,967 | 11/1975 | Warning et al. | 118/301 |
| 4,077,356 | 3/1978 | Andrews | 118/301 |
| 4,492,180 | 1/1985 | Martin | 118/504 |
| 4,632,291 | 12/1986 | Rahn et al. | 228/37 |
| 4,662,310 | 5/1987 | Faber | 118/504 |
| 4,682,723 | 7/1987 | Grummett | 228/37 |
| 4,717,064 | 1/1988 | Popielarski et al. | 228/39 |
| 4,832,250 | 5/1989 | Spigarelli et al. | 228/102 |
| 4,858,816 | 8/1989 | Gontier | 228/39 |

FOREIGN PATENT DOCUMENTS

| | | | |
|---|---|---|---|
| 0278885 | 8/1988 | European Pat. Off. | 228/37 |
| 2829242 | 1/1979 | Fed. Rep. of Germany | 118/504 |
| 15063 | 5/1976 | Japan | 118/406 |

Primary Examiner—Sam Heinrich
Attorney, Agent, or Firm—Jones, Tullar & Cooper

[57] ABSTRACT

An electronically controlled mask shield for a wave soldering machine is disclosed which can be positioned to shield gold contacts on printed wiring boards (PWBs) during a wave soldering operation. The shield is a trough shaped member that is attached by a frame assembly to a conveyor rail of a conventional wave soldering machine. The frame assembly includes a pair of support sleeves to which the two ends of the shield are attached. The support sleeves are movable with respect to the conveyor rail between a retracted position and any desired extended position by means of a motor, and a chain and sprocket drive mechanism. A motor control circuit enables the shield to be positioned as desired, and a position responsive sensor is attached to the drive mechanism to provide signals for a position indicating display. The motor control circuit can be either manually controlled, or automatically controlled by a microprocessor.

11 Claims, 5 Drawing Sheets

ELECTRONICALLY CONTROLLED WAVE SOLDER MASK SHIELD

BACKGROUND OF THE INVENTION

The present invention relates in general to an electronically controlled mask shield for use with a wave soldering machine to protect portions of circuit modules, such as gold contacts, during a wave soldering operation.

In the mass production of printed circuit modules, printed wiring boards (PWBs) are passed through a soldering apparatus wherein one side of the PWBs is subjected to a soldering operation to solder hundreds of terminals on each of the boards. The use of wave soldering machines for this purpose is well known. These machines include conveyors which carry the PWBs over a molten bath of solder that is agitated to rise in waves against the undersides of the PWBs.

One of the problems presented by the wave soldering process is that of protecting portions of the PWBs from being contacted by the hot molten solder. In particular, a plurality of gold contacts are disposed on PWBs which are used to connect the circuit board components to other boards or connectors. These gold contacts must be protected from the molten solder because it will contaminate or degrade the contacts.

One solution to this problem has been to install shields on the wave soldering machines which prevent the molten solder from contacting the gold contact areas of the PWBs. Typically, these shields are mechanically bolted in place on the wave soldering machines when they are needed. This requires that an operator gain access to the interior of the wave soldering machine, bolt the shield into place, and make manual adjustments to properly align the shield. The alignment procedure often requires that a PWB be passed through the wave soldering machine to check the alignment accuracy Once the wave soldering operation is completed, the shield must once again be manually removed. This entire procedure takes a considerable amount of time. In addition, environmental and safety concerns have led to the advent of fully enclosed wave soldering machines which cannot be easily accessed. As a consequence, the use of a manually attached and adjustable solder shield with such a machine is made extremely difficult and inconvenient, if not altogether impossible.

SUMMARY OF THE INVENTION

The present invention eliminates the drawbacks of the prior art by providing an electronically controlled wave solder mask shield assembly which is permanently attached to a wave soldering machine, and is electronically positionable from a remote location so that it can be quickly positioned for use when needed, and retracted out of the way when not needed.

The shield is a long trough shaped member which is postionable between the solder bath of the wave soldering machine and the gold contact containing portions of the PWBs to shield the gold contacts from the solder. The shield is mounted on a frame with a pair of support sleeves that are movable in a lateral direction relative to the wave soldering machine conveyor rail to adjust the position of the shield over the PWBs. A drive system consisting of a bidirectional servo motor and a chain and sprocket drive is employed to move both support sleeves simultaneously to a desired setting. Each of the sleeves has a threaded inner portion which receives a helical screw that is attached to a sprocket in the drive system. Rotation of the screws causes the lateral position of the sleeves, and therefore the shield, to change.

A digital display, which is connected to the servo motor, displays the position of the shield by sensing the rotations of the motor. The motor can be manually controlled by a variable speed control or automatically controlled by a microprocessor. If a microprocessor control is employed, the desired settings of the shield based on the particular PWBs to be soldered are either entered into the microprocessor, or are selected by the microprocessor from a group of settings in memory. Control signals are then sent to the servo motor to position the shield at the desired settings.

The shield frame is attached to one of the conveyor rails of the wave soldering machine by means of two brackets that are pivotably mounted to the shield frame. For circumstances where the shield is not needed at all, the brackets allow the shield to retract down under and behind a plurality of PWB support fingers on the conveyor rail of the soldering machine. Normally, the fingers stick down into the trough portion of the shield. This arrangement would prevent the shield from being retracted away from the conveyor if not for the brackets which allow the shield to pivot away from the fingers during retraction.

BRIEF DESCRIPTION OF THE DRAWINGS

The features and advantages of the present invention will become apparent to those of skill in the art from the following more detailed consideration thereof, taken in conjunction with the accompanying drawings, in which.

DETAILED DESCRIPTION OF THE PREFERRED EMBODIMENT

Figure 1:
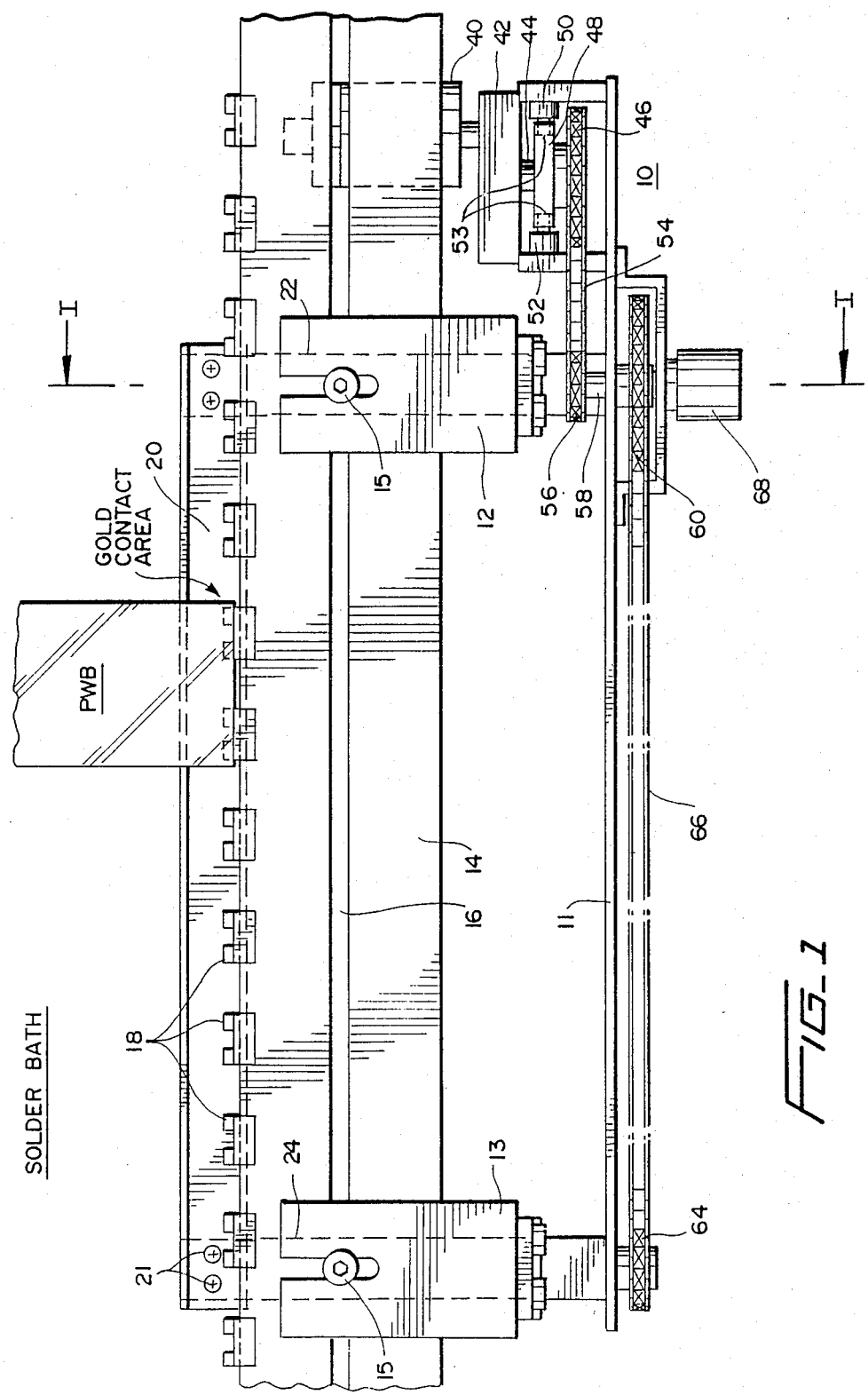
FIG. 1 is a top plan of a solder shield assembly shown attached to a wave soldering machine conveyor rail.
Figure 2:
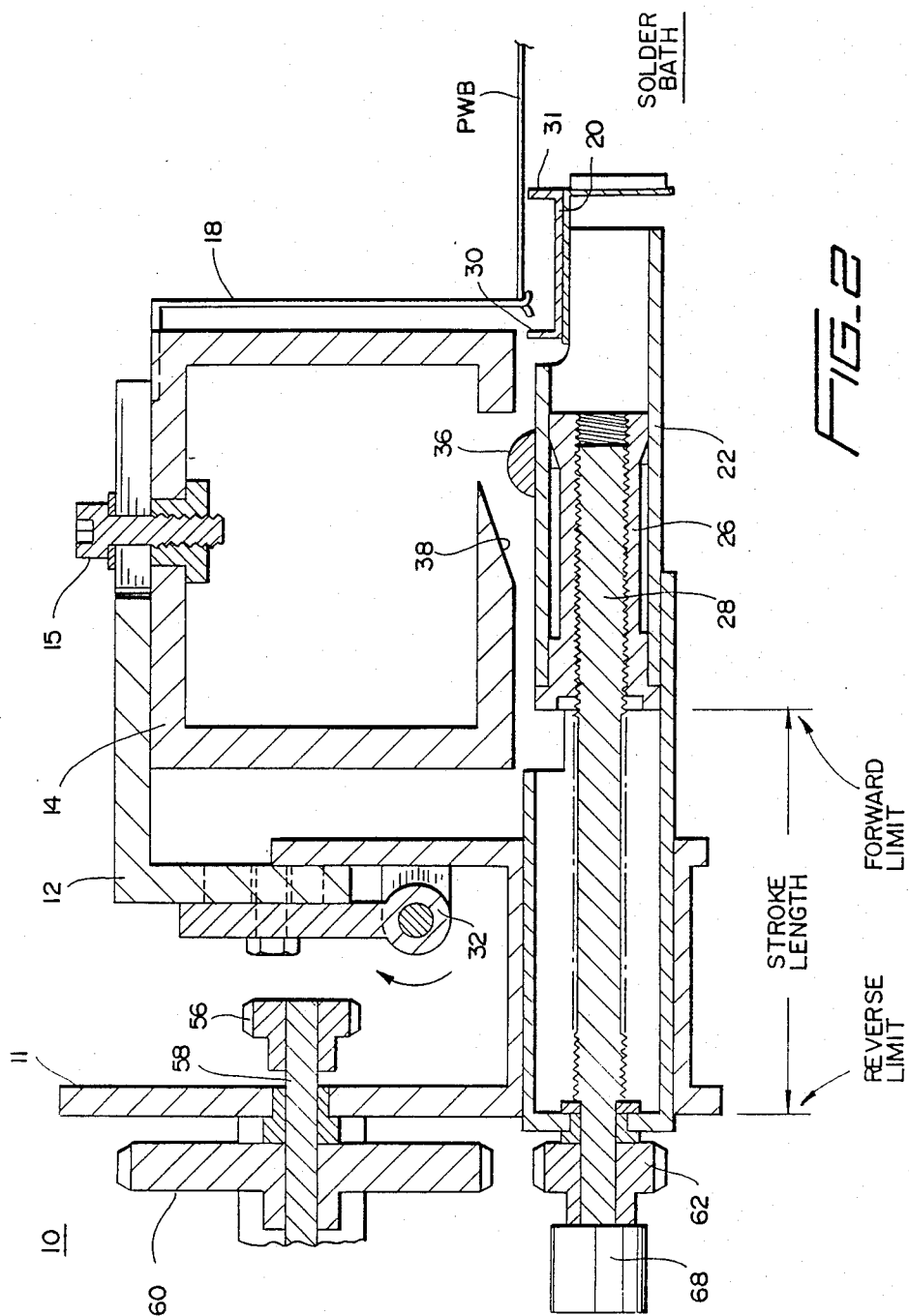
FIG. 2 is a sectional side elevation of the shield assembly taken along line I—I of FIG. 1.
Figure 3:
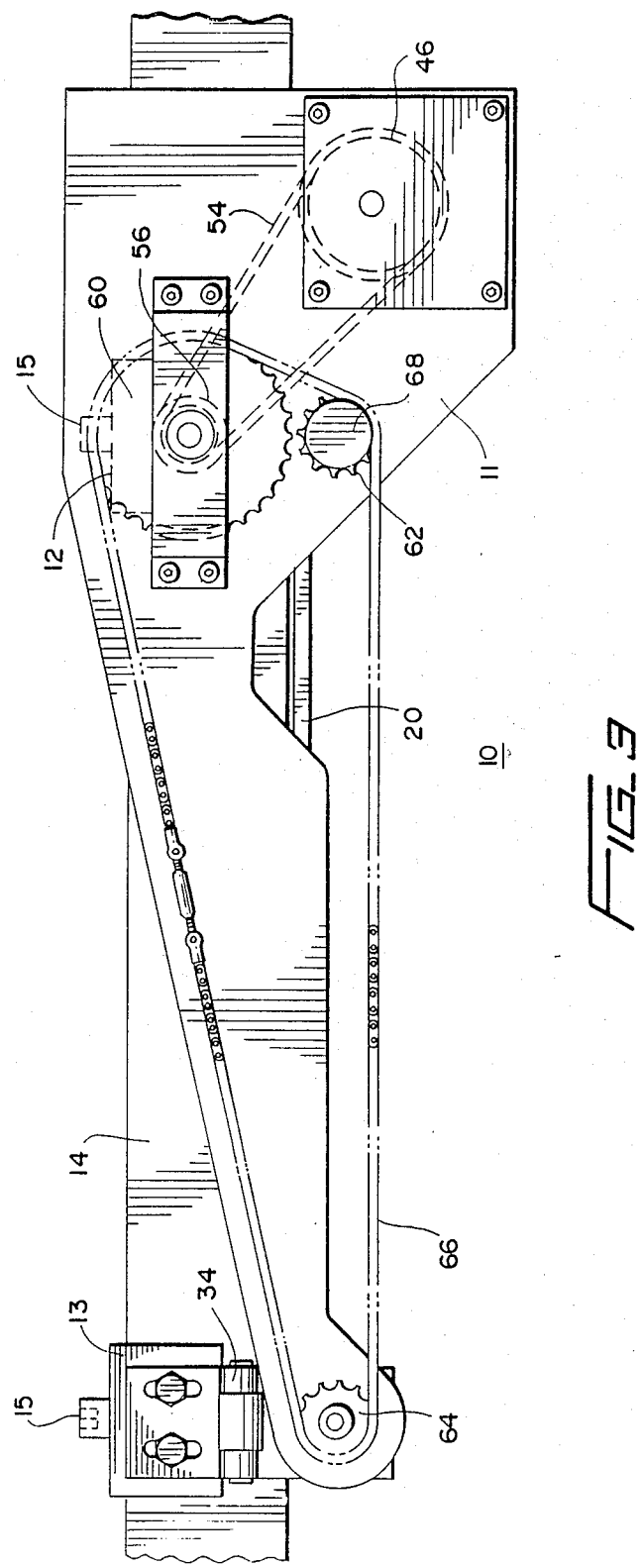
FIG. 3 is a front elevation of the shield assembly.

Turning now to a more detailed consideration of the invention, there is illustrated in FIGS. 1-3, a solder shield assembly 10, which includes a frame 11 that is mounted by means of a pair of brackets 12 and 13, to a wave soldering machine conveyor rail 14. Brackets 12 and 13 are attached by means of a pair of nut and bolt assemblies 15 through a slot 16 in conveyor rail 14. As is conventional, a plurality of depending PWB support fingers 18 are positioned on conveyor rail 14 which are driven by a chain (not shown) beneath rail 14. A portion of a PWB is illustrated in FIG. 1 that is supported at one end by a pair of the support fingers 18. Another similar conveyor rail assembly (not shown) is employed to support the opposite end of the PWB. As the fingers 18 are moved along the conveyor rail 14, the bottom of the PWB is exposed to a wave of solder from a solder bath below.

Typically, the PWBs to be soldered have a plurality of gold contacts disposed in the area near the ege supported by the finger supports 18, which must be shielded from the solder to prevent the contacts from being contaminated. For this reason, a trough shaped solder shield 20 is retractably positioned on shield assembly 10 between the supported edge of the PWBs, and the solder bath.

Solder shield 20 is supported by, and attached with a plurality of screws 21 to, a pair of movable support sleeves 22 and 24, one at each end of shield 20. As illustrated in FIG. 2, each of the support sleeves 22 and 24 contains an inner threaded portion 26 which receives a screw 28. Each of the screws 28 are rotatable by a gear drive mechanism (to be discussed in greater detail below) to change the lateral position of shield 20 beneath the PWBs as desired.

Shield 20 includes an inner vertical edge 30 and an outer vertical edge 31. Since outer edge 31 will interfere with finger supports 18 during complete retraction of shield 20, solder shield assembly 10 is mounted to brackets 12 and 13 with a pair of pivot mounts, 32 and 34. These mounts allow shield 20 to pivot slightly downward away from finger supports 18 during retraction of the shield. To cause this action, a knob 36 is disposed on top of support sleeve 22 which engages a ramp edge 38 that is mounted on conveyer rail 14 as illustrated in FIG. 2. When sleeve 22 is retracted, knob 36 engages ramp edge 38, and the entire solder shield assembly 10 is caused to pivot downward slightly so that the outer edge 31 of shield 20 will clear finger supports 18.

As illustrated in FIG. 1, a servo motor 40 is attached to a drive mechanism for support sleeves 22 and 24. The drive mechanism includes a gear box assembly 42 having a first drive shaft 44 and a first drive sprocket 46. A rotatable cam wheel 48 is also disposed on shaft 44, and is used to actuate a pair of normally closed limit switches 50 and 52. Cam wheel 48 is of a conventional design, and includes a pair of notches 53 (illustrated by the dashed lines in FIG. 1) for causing the limit switches to open. The positioning of limit switches 50 and 52 relative to cam wheel 48 can be chosen as desired to select the opening points of the switches. As illustrated in FIG. 2, the opening points of the switches determine the forward and reverse limits, and thereby the stroke length, of support sleeves 22 and 24. The circuitry for limit switches 50 and 52 is discussed below.

As illustrated in FIGS. 2 and 3, the drive mechanism further includes a first drive chain 54 which is driven by first drive sprocket 46 to drive a second drive sprocket 56 that is connected through a second drive shaft 58 to a third drive sprocket 60. Third drive sprocket 60 drives a pair of sleeve drive sprockets 62 and 64 through a second drive chain 66. Sleeve drive sprockets 62 and 64 are connected to screws 28 of sleeves 22 and 24, respectively, and serve to position the sleeves, and therefore shield 20, in a desired lateral position beneath the PWBs. As best illustrated in FIGS. 1 and 2, a potentiometer type rotation sensor 68 is disposed next to sleeve drive sprocket 62 on the end of screw 28 of support sleeve 22. Rotation sensor 68 is responsive to the lateral position of shield 20, and provides signals to a display circuit (to be described below) which indicates the position of shield 20.

Figure 4:
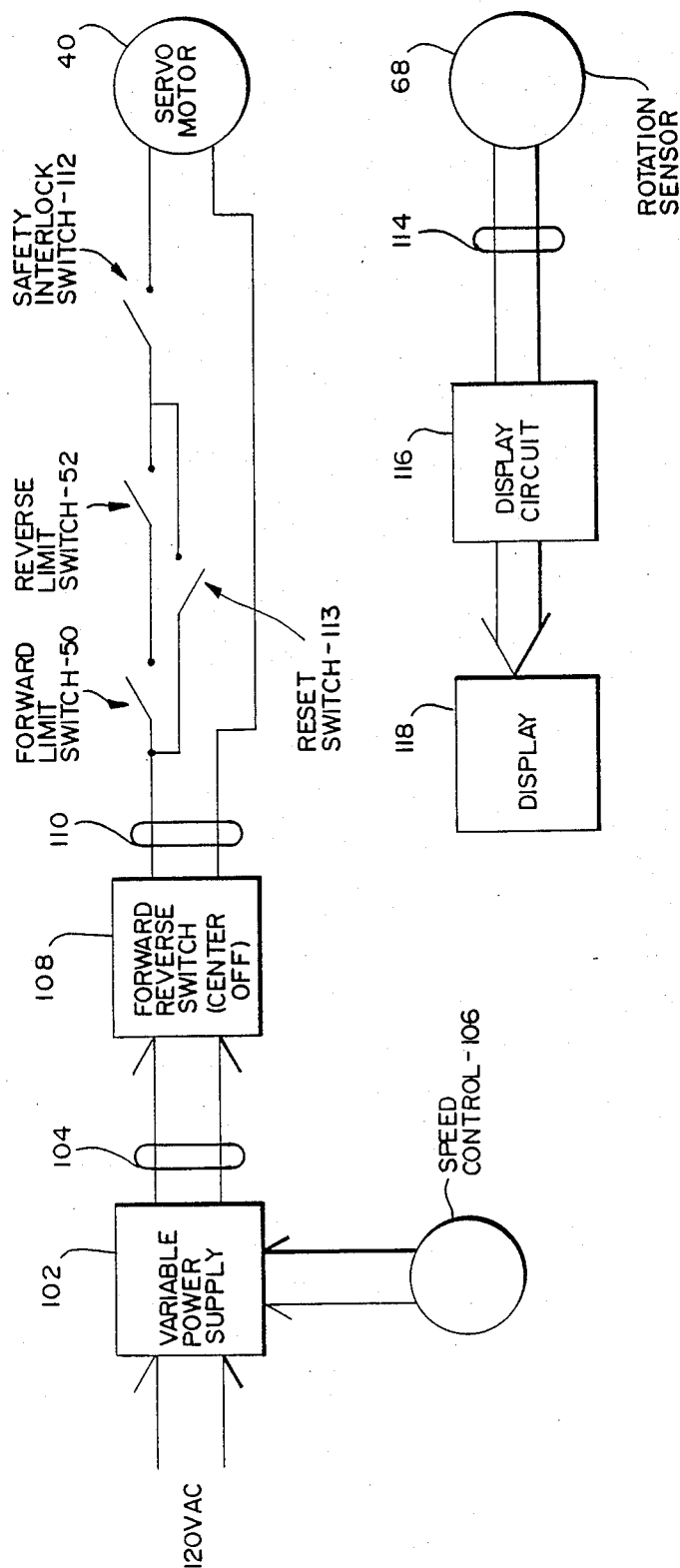
FIG. 4 is a block diagram of a motor control circuit for the solder shield of the present invention; and, FIG. 5 is a block diagram of another embodiment of a motor control circuit which utilizes a microprocessor.

Turning now to FIG. 4, there is illustrated a general block diagram of a motor control circuit 100 for the solder shield. In particular, a variable power supply 102 is shown, which receives 120 VAC as an input, and provides a variable voltage output 104. The output voltage is varied by a speed control 106, which can be a potentiometer, for example, and is fed to a forward/reverse switch 108, which can be a center-off toggle switch. An output 110 is fed from forward/reverse switch 108 through limit switches 50 and 52, and a safety interlock switch 112 to servo motor 40. Limit switches 50 and 52 are normally closed, and open in response to the rotation of cam wheel 48 as discussed previously. These switches prevent the shield 20 from being extended or retracted beyond a range determined by the positioning of the switches relative to cam wheel 48, and disconnect power to servo motor 40 once either the forward or reverse limit has been reached. A normally open reset switch 113 is provided which can be closed to bypass limit switches 50 and 52 so that power can be supplied to motor 40 once one of the limit switches 50 or 52 has been triggered. This enables the shield 20 to be moved back away from the forward or reverse limit. The safety interlock switch 112 is normally closed, and is utilized to insure that shield 20 cannot be moved unless the conveyor is in its proper operating position. Interlock switch 112 can be attached to any suitable location on the wave soldering machine to detect the conveyor position.

An output 114 from rotation sensor 68 is fed to a display circuit 116, and a corresponding digital display 118 for providing a numerical indication, in thousandths of an inch, of the position of shield 20 relative to its reverse limit. The display is utilized by the operator to enable proper position of shield 20 with speed control 106 and forward/reverse switch 108 in accordance with a list of position values for each type of PWB to be soldered by the wave soldering machine. It will be understood that speed control 106, forward/reverse switch 108, reset switch 113 and digital display 118 are all preferably located remote from the wave soldering machine so that the position of shield 20 can be changed without the operator having to gain access to the wave soldering machine.

Figure 5:
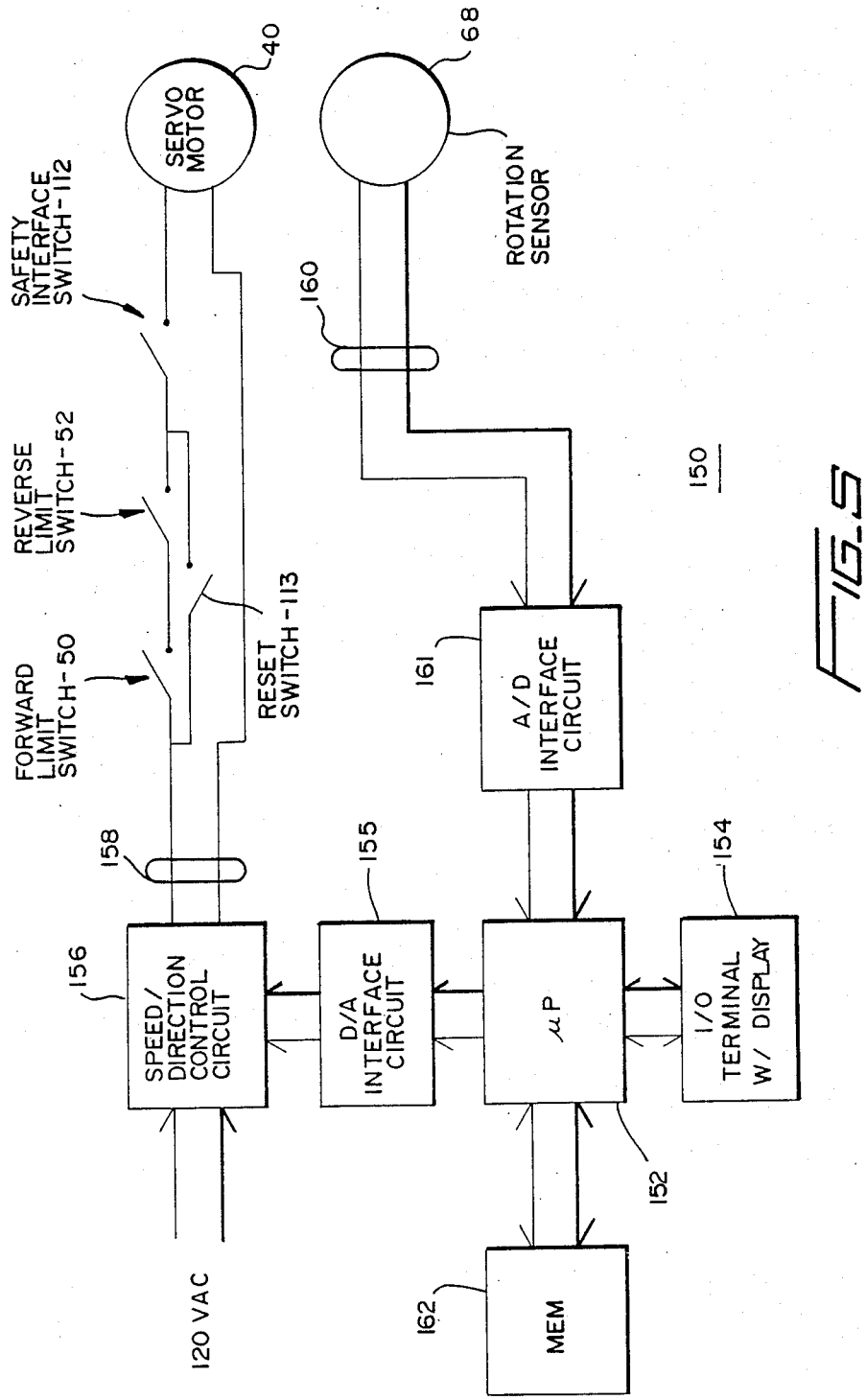

A block diagram of another control circuit 150 for the solder shield assembly is illustrated in FIG. 5. Control circuit 150 is fully automatic, and employs a microprocessor 152 to position shield 20 in accordance with instructions entered by an operator through an I/O terminal and display 154. Microprocessor 152 is connected through a D/A interface circuit 155 to a speed/direction control circuit 156, which is similar to the speed control 106 and forward/reverse switch 108 of FIG. 4. Speed/direction control circuit 156 generates a variable magnitude and polarity output voltage on an output 158 in response to control signals from microprocessor 152. Output 158 is fed through switches 50, 52, 112 and 113 to servo motor 40, in the same manner as that of control circuit 100 of FIG. 4.

An output 160 is fed from rotation sensor 68 through an A/D interface circuit 161 to microprocessor 152 to provide shield position information for I/O terminal and display 154, as well as for microprocessor 152. A memory 162 is connected to microprocessor 152 for storing position data for different PWBs.

In the operation of control circuit 150, an operator enters data regarding the PWB to be soldered into microprocessor 152 via I/O terminal and display 154. Microprocessor 152 compares the position data (either obtained from memory 162 or entered directly by the operator) to the current position of the shield as sensed by rotation sensor 168. Microprocessor 152 then generates appropriate control signals for speed/direction control circuit 156 to move the shield to the desired position. After the soldering operation has been completed, the operator can enter a command to cause microprocessor 152 to fully retract the shield.

Although the invention has been disclosed in terms of a preferred embodiment, it should be understood that numerous modifications and variations could be made thereto without departing from the true spirit and scope thereof, as set forth in the following claims.

What is claimed is:

1. An electronically controlled solder shield assembly for a wave soldering machine having a solder bath, and a conveyor for carrying PWBs through a solder bath, comprising:
   a shield;
   a means for mounting said shield on a conveyor rail of a wave soldering machine for shielding portions of a PWB from a solder bath; and,
   a drive means to movably position said shield with respect to a conveyor rail in a first retracted position and in at least a first extended position where said shield is disposed between a portion of a PWB to be shielded from solder, and a solder bath.

2. The solder shield assembly of claim 1 wherein said means for mounting said shield comprises:
   first and second support means attached to said shield at first and second ends, respectively; and,
   a frame attached to said support means for attachment to a conveyor rail.

3. The solder shield assembly of claim 2, wherein said drive means to movably position said shield comprises:
   a motor means; and,
   a drive mechanism connected between said motor means and said support means for selectively retracting and extending said support means relative to a conveyor rail.

4. The solder shield assembly of claim 3, wherein said drive mechanism comprises:
   a sprocket and chain drive arrangement connected to, and driven by, said motor means including a first sprocket attached to a helical screw which is threaded into an interior threaded portion of said first support means, and a second sprocket attached to a helical screw which is threaded into an interior threaded portion of said second support means.

5. The solder shield assembly of claim 3, further comprising:
   a motor control means connected to said motor means to selectively position said shield;
   a shield positon responsive sensor means connected to said drive mechanism; and,
   a shield position display means connected to said sensor means.

6. The solder shield assembly of claim 5, wherein said motor control means and said shield position display means are disposed in a location remote from a wave soldering machine to which said shield is attached.

7. The solder shield assembly of claim 5, further comprising:
   a microprocessor means connected both to said motor control means and said shield position responsive sensor means to automatically position said shield in a desired position.

8. The solder shield assembly of claim 1, further comprising:
   a control means connected to said drive means to selectively position said shield; and,
   to said drive means.

9. The solder shield assembly of claim 8, further comprising:
   a microprocessor means connected both to said control means and said shield position responsive sensor means to automatically position said shield in a desired position.

10. An electronically controlled solder shield assembly for a wave soldering machine having a solder bath, and a conveyor for carrying PWBs through a solder bath, comprising:
    a shield;
    a means for attaching said shield to a wave soldering machine for shielding portions of a PWB from a solder bath, said means comprising:
    (a) first and second support means attached to said shield at first and second ends, respectively; and
    (b) a frame attached to said support means for attachment to a conveyor rail of a wave soldering machine; and,
    a drive means to movably position said shield with respect to a conveyor rail in a first retracted position and in at least a first extended position where said shield is disposed between a portion of a PWB to be shielded from solder, and a solder bath.

11. The solder shield assembly of claim 10 wherein said drive means to movably position said shield comprises:
    a motor means; and,
    a sprocket and chain drive arrangement connected to, and driven by, said motor means including a first sprocket attached to a helical screw which is threaded into an interior threaded portion of said first support means, and a seacond sprocket attached to a helical screw which is threaded into an interior threaded portion of said second support means.

* * * * *

UNITED STATES PATENT AND TRADEMARK OFFICE
CERTIFICATE OF CORRECTION

PATENT NO. : 4,981,248

DATED : January 1, 1991

INVENTOR(S) : JAMES L. HALL

It is certified that error appears in the above-identified patent and that said Letters Patent is hereby corrected as shown below:

Column 6, line 15;

Claim 8, line 5 of the claim, --a shield position responsive sensor means connected-- should be inserted before "to said drive means".

Signed and Sealed this

Twenty-eighth Day of April, 1992

Attest:

HARRY F. MANBECK, JR.

Attesting Officer

Commissioner of Patents and Trademarks